(12) United States Patent
Liaw

(10) Patent No.: US 7,271,451 B2
(45) Date of Patent: Sep. 18, 2007

(54) MEMORY CELL STRUCTURE

(75) Inventor: Jhon-Jhy Liaw, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 51 days.

(21) Appl. No.: 11/340,397

(22) Filed: Jan. 26, 2006

(65) Prior Publication Data

US 2006/0131614 A1    Jun. 22, 2006

Related U.S. Application Data

(62) Division of application No. 10/723,331, filed on Nov. 26, 2003, now Pat. No. 7,023,056.

(51) Int. Cl.
*H01L 29/76* (2006.01)
*H01L 29/94* (2006.01)
*H01L 31/00* (2006.01)

(52) U.S. Cl. ............... 257/369; 257/903; 257/E27.098; 257/E21.661

(58) Field of Classification Search ............... 257/369, 257/903, E27.098, E21.661
See application file for complete search history.

(56) References Cited

U.S. PATENT DOCUMENTS

| | | | |
|---|---|---|---|
| 5,012,443 A | 4/1991 | Ema | |
| 6,417,530 B1 | 7/2002 | Jung | |
| 6,445,049 B1 | 9/2002 | Iranmanesh | |
| 6,643,167 B2 | 11/2003 | Nii | |
| 6,710,412 B2 | 3/2004 | Tsukamoto et al. | |
| 6,777,286 B2 | 8/2004 | Clevenger et al. | |
| 6,791,200 B2 * | 9/2004 | Nii | 257/206 |
| 6,822,300 B2 * | 11/2004 | Nii | 257/390 |
| 6,828,689 B2 | 12/2004 | Madurawe | |
| 6,924,560 B2 * | 8/2005 | Wang et al. | 257/67 |
| 6,972,450 B2 * | 12/2005 | Liaw | 257/296 |
| 2002/0024049 A1 | 2/2002 | Nii et al. | |
| 2004/0007720 A1 | 1/2004 | Clevenger et al. | |
| 2005/0121810 A1 | 6/2005 | Mali et al. | |

OTHER PUBLICATIONS

Osada, K., et al., "Cosmic-Ray Multi-Error Immunity for SRAM, Based on Analysis of the Parasitic Bipolar Effect," Symposium on VLSI Circuits Digest of Technical Papers, (2003) pp. 255-258.
Degalahal, V., et al., "Analyzing Soft Errors in Leakage Optimized SRAM Design," Proceedings of the 16th International Conference on VLSI Design (2003) 7 pgs.

* cited by examiner

*Primary Examiner*—Ngân V. Ngô
(74) *Attorney, Agent, or Firm*—Slater & Matsil, L.L.P.

(57) ABSTRACT

A memory structure that reduces soft-errors for us in CMOS devices is provided. The memory cell layout utilizes transistors oriented such that the source-to-drain axis is parallel a shorted side of the memory cell. The dimensions of the memory cell are such that it has a longer side and a shorter side, wherein the longer side is preferably about twice as long as the shorter side. Such an arrangement uses a shorter well path to reduce the resistance between transistors and the well strap. The shorter well strap reduces the voltage during operation and soft errors.

33 Claims, 5 Drawing Sheets

MEMORY CELL STRUCTURE

This application is a divisional of patent application Ser. No. 10/723,331, entitled "Memory Cell Structure," filed on Nov. 26, 2003 now U.S. Pat No. 7,023,056, which application is incorporated herein by reference.

TECHNICAL FIELD

The present invention relates generally to semiconductor devices, and more particularly to a memory cell layout for integrated circuits.

BACKGROUND

Complementary metal-oxide-semiconductor (CMOS) technology is the dominant semiconductor technology used for the manufacture of ultra-large scale integrated (ULSI) circuits today. Size reduction of the semiconductor structures has provided significant improvement in the speed, performance, circuit density, and cost per unit function of semiconductor chips over the past few decades. Significant challenges, however, are faced as the sizes of CMOS devices continue to decrease.

One such challenge is soft errors. Soft errors are errors that occur in the logic state of a circuit due to excess charge carriers, which are typically induced by alpha-particles and cosmic ray neutrons. As the excess charge carriers are induced into a circuit, the logic values may be altered. For example, a logic value of a capacitor or line may be altered from a logic "0" to a logic "1," transistor gates may be turned off or on, or the like. Soft errors occurring in SRAM devices or other memory devices can cause the stored data to become corrupted.

Attempts have been made to limit the effect of excess charge carriers and soft errors on integrated circuits. One such attempt involves the addition of error-correcting circuitry (ECC). Another attempt involves increasing the cell size to increase the capacitance of charge nodes, thereby decreasing the effect of excess charge carriers. Yet another attempt requires additional capacitance, such as a MIM structure, trench capacitor, stack capacitor, or the like, to be added to the charge node. Yet another attempt involves increasing the resistance between the source/drain areas of the charge node and the gate of the charge node. Yet other attempts involve reducing the well resistance and/or increasing the well strapping frequency.

These attempts, however, generally require additional circuitry, additional processing, increased power requirements, and/or increased sizes, which may adversely affect the design and fabrication of smaller, more power-efficient integrated circuits.

Therefore, there is a need for an integrated circuit that is more resilient to soft errors and excess charge carriers.

SUMMARY OF THE INVENTION

These and other problems are generally reduced, solved or circumvented, and technical advantages are generally achieved, by embodiments of the present invention, which provides structures and layouts for a memory cell layout for integrated circuits.

In one embodiment of the present invention, a 6T-SRAM is provided having a unit memory-cell such that the unit memory cell has a short side and a long side. The long side is preferably at least twice as long as the short side. The source-to-drain axis is substantially parallel to the shorter side of the unit memory cell.

In another embodiment of the present invention, an 8T-SRAM is provided having a unit memory cell such that the unit memory cell has a short side and a long side. The long side is preferably at least twice as long as the short side. The source-to-drain axis is substantially parallel to the shorter side of the unit memory cell.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. In particular, the method of the present invention is described in the context of forming a 6T-SRAM and an 8T-SRAM. One of ordinary skill in the art, however, will appreciate that features of the present invention described herein may be used for forming other types of devices, such as other SRAM configurations and memory devices other than SRAMs. Accordingly, the specific embodiments discussed herein are merely illustrative of specific ways to make and use the invention, and do not limit the scope of the invention.

Figure 1:
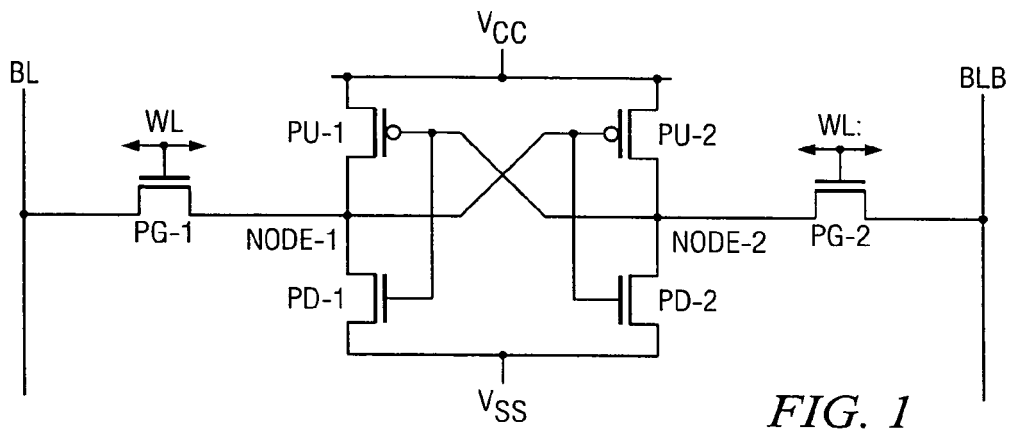
FIG. 1 is a schematic diagram of a typical 6T-SRAM.

Referring first to FIG. 1, a schematic diagram of a 6T-SRAM cell for reference is shown. Generally, the 6T-SRAM cell comprises a first pass-gate transistor PG-1, a second pass-gate transistor PG-2, a first pull-up transistor PU-1, a second pull-up transistor PU-2, a first pull-down transistor PD-1, and a second pull-down transistor PD-2.

In operation, the memory cell forms two complementary nodes, node-1 and node-2. Because node-1 is tied to the gate of the second pull-up transistor PU-2 and node-2 is tied to the gate of the first pull-up transistor PU-1, the values stored in each node will remain complementary to each other. For example, when node-1 is high, the PMOS second pull-up transistor PU-2 prevents the current from the current source $V_{cc}$ from flowing to node-2. In parallel, the gate of the NMOS second pull-down transistor PD-2 is activated, allowing any charge that may be in node-2 to go to ground. Furthermore, when node-2 is low, the PMOS first pull-up transistor PU-1 allows current to flow from $V_{cc}$ to node-1, and the gate of the NMOS first pull-down transistor PD-1 is de-activated, preventing the charge in node-1 from going to ground. The gates of the first pass-gate transistor PG-1 and the second pass-gate transistor PG-2 are electrically coupled to a word line (WL) to control reading data from and writing data to the memory cell. Values stored in node-1 and node-2 are read on a bit-line (BL) and a complementary-BL, respectively, which are electrically coupled to a sense amplifier (not shown).

Figure 2:
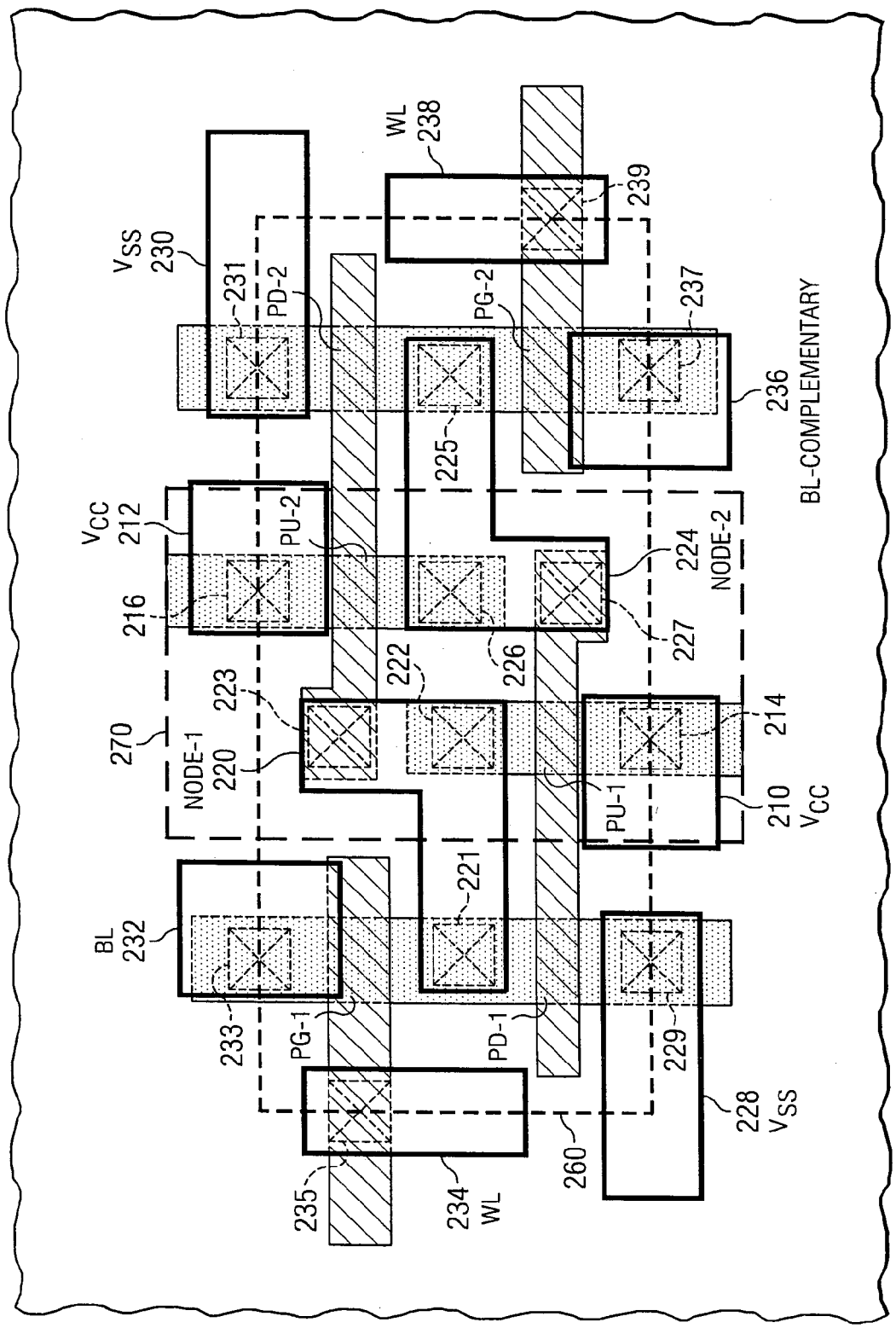
FIG. 2 is a plan view of transistor formation and the M1 layer of a 6T-SRAM in accordance with one embodiment of the present invention.
Figure 3:
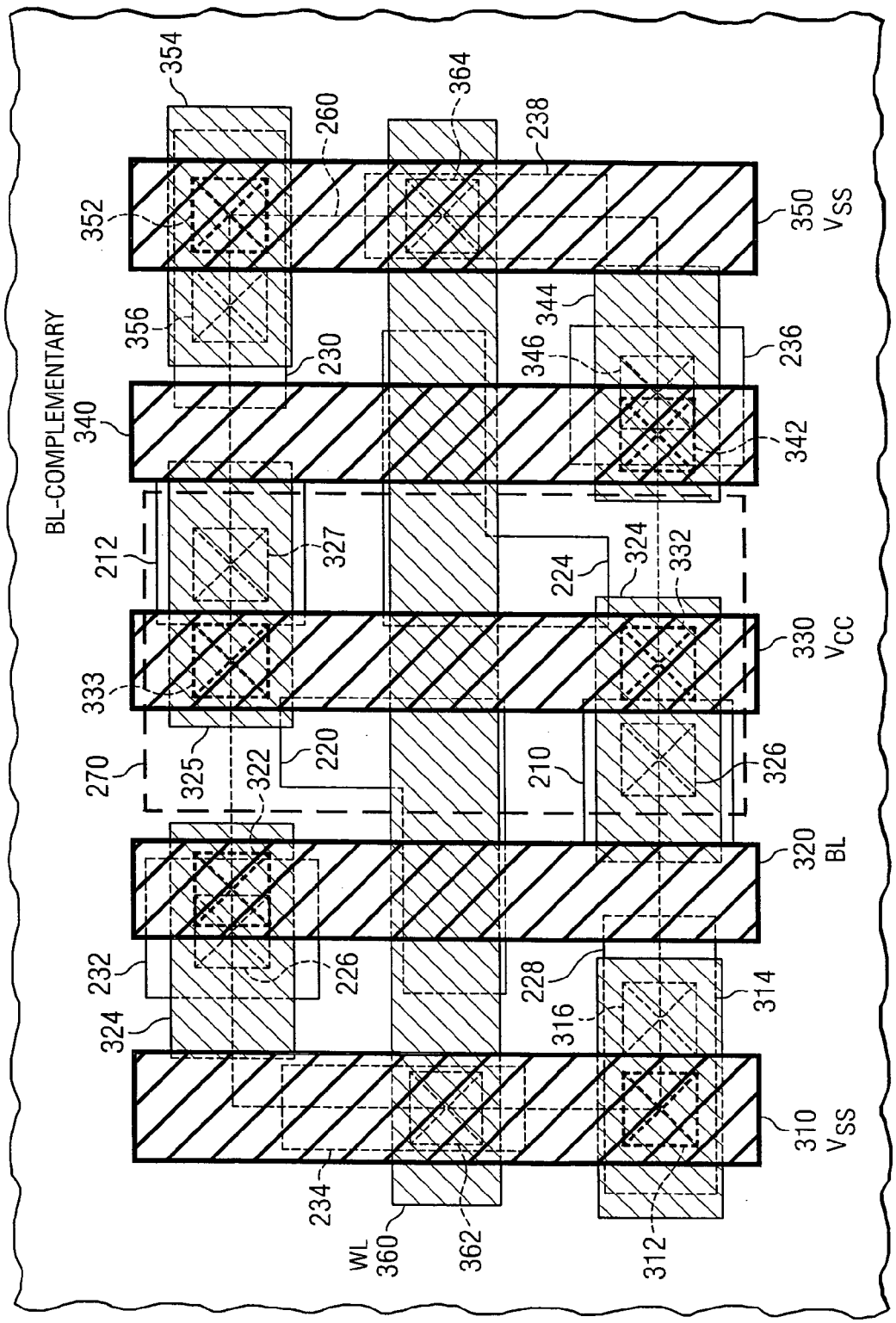
FIG. 3 is a plan view of the M1, M2, and M3 layers of a first embodiment of the present invention.
Figure 4:
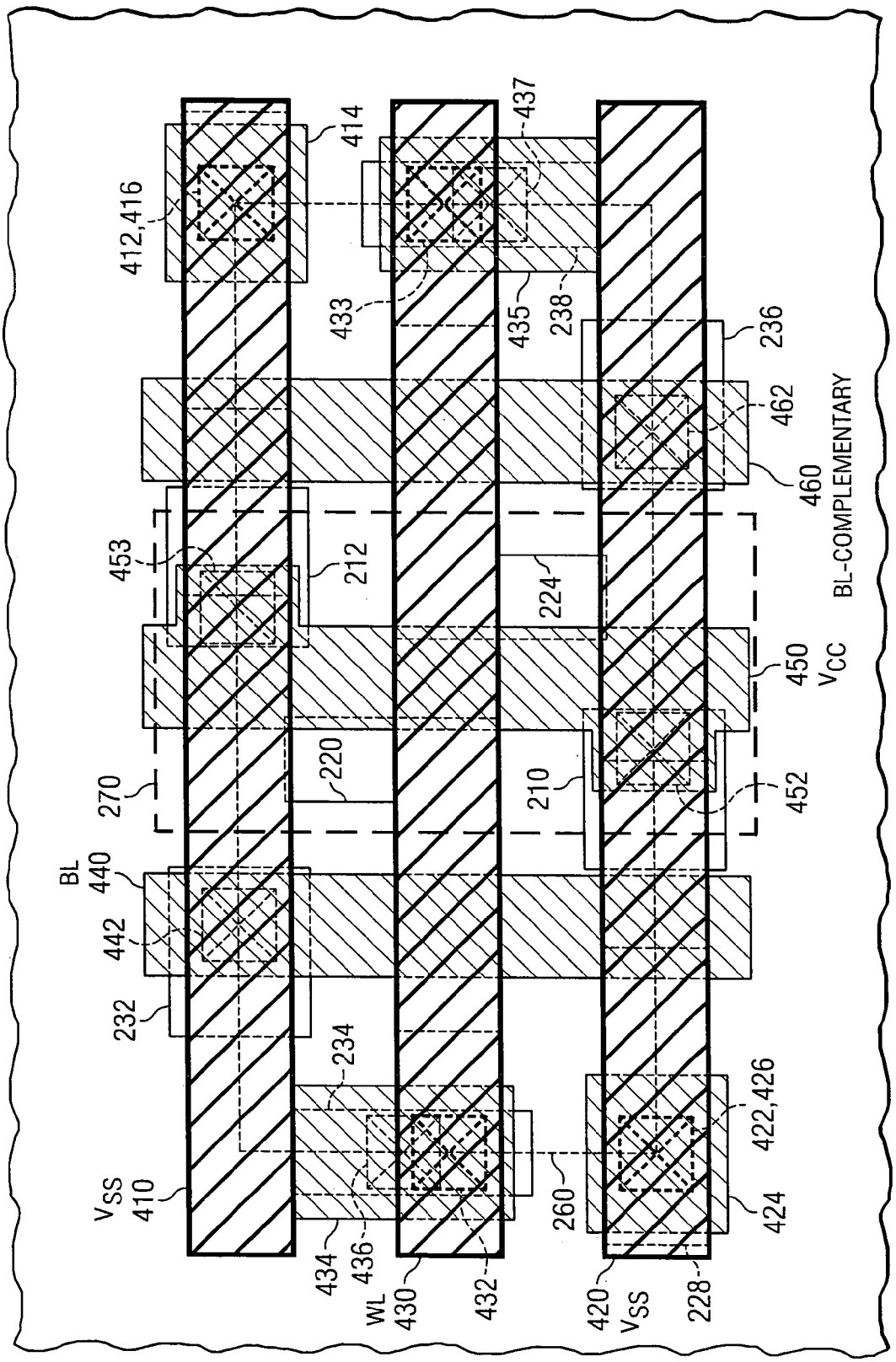
FIG. 4 is a plan view of the M1, M2, and M3 layers of a second embodiment of the present invention.

FIGS. 2-4 are plan views of a layout of a 6T-SRAM cell in accordance with one embodiment of the present invention. Specifically, FIG. 2 is a plan view combining the semiconductor devices (active area and polysilicon) and the first metal layer (M1); FIG. 3 is a plan view combining M1, metal layer 2 (M2), and metal layer 3 (M3) in accordance with a first embodiment of the present invention; and FIG. 4 is a plan view combining M1, M2, and M3 in accordance with a second embodiment of the present invention.

Referring now to FIG. 2, the 6T-SRAM cell comprises a first pass-gate transistor PG-1, a second pass-gate transistor PG-2, a first pull-up transistor PU-1, a second pull-up transistor PU-2, a first pull-down transistor PD-1, and a second pull-down transistor PD-2 formed on a substrate. For illustrative purposes, thick-lined rectangles with no fill indicate contact lines formed on M1. The substrate may be, for example, formed of bulk Si, SiGe, strained-Si, SOI, non-bulk Si, or the like. The gate thicknesses of the transistors are preferably less than about 1000 Å and may be of varying widths. The first and second pull-down transistors, however, preferably have a gate width of less than about 40 nm. The gate dielectric layer of the transistors may be a single layer or multiple layers, wherein at least one layer preferably comprises SiO2, nitrided oxide, a nitrogen-containing oxide, SiON, a metal oxide, a high-K dielectric, or a combination thereof. Furthermore, it is preferred that the gate oxide layer have a thickness of less than 13 Å. It has been found that using the parameters described herein, a memory cell may be fabricated having a preferred maximum storage capacitance of less than about 0.5 femto-farad.

Preferably, the first pull-up transistor PU-1 and the second pull-up transistor PU-2 are PMOS transistors formed in an n-well 270, or a deep n-well, and the other transistors are NMOS transistors. The sources of the first pull-up transistor PU-1 and the second pull-up transistor PU-2 are electrically coupled to a voltage source $V_{cc}$ contact lines 210 and 212, respectively, located on M1, via plugs 214 and 216.

The drain of the first pull-up transistor PU-1, the drain of the first pull-down transistor PD-1, the drain of the first pass-gate transistor PG-1, and the gates of the second pull-up transistor PU-2 and the second pull-down transistors PD-2 are electrically coupled via an intra-cell connection 220 located on M1 and plugs 221, 222, and 223. Similarly, the drain of the second pull-up transistor PU-2, the drain of the pull-down transistor PD-2, the drain of the second pass-gate transistor PG-2, and the gates of the first pull-up transistor PU-1 and the first pull-down transistor PD-1 are electrically coupled via an intra-cell connection 224 located on M1 and plugs 225, 226, and 227.

The source of the first pull-down transistor PD-1 is electrically coupled to ground $V_{ss}$ via $V_{ss}$ contact line 228 and plug 229; and the source of the second pull-down transistor PD-2 is electrically coupled to ground $V_{ss}$ via $V_{ss}$ contact line 230 and plug 231.

The source of the first pass-gate transistor PG-1 is electrically coupled to the BL via a BL contact line 232 and plug 233. The first pass-gate transistor PG-1 electrically couples the BL to the drain of the first pull-up transistor PU-1 and the drain of the first pull-down transistor PD-1. The gate of the first pass-gate transistor PG-1 is electrically coupled to the WL via a WL contact line 234 on M1 and plug 235.

The source of the second pass-gate transistor PG-2 is electrically coupled to the complementary-BL via a complementary-BL contact line 236 and plug 237. Similarly, the second pass-gate transistor PG-2 electrically couples the BLB to the drain of the second pull-up transistor PU-2 and the drain of the second pull-down transistor PD-2. The gate of the second pass-gate transistor PG-2 is electrically coupled to the WL via a WL contact line 238 on M1 and plug 239. One of ordinary skill in the art will appreciate that the above structure defines a unit or memory cell 260, as illustrated by the dotted line. The unit cell 260 defines the basic building block for designing memory cells and may be duplicated to create larger memories. In the preferred embodiment, the length of the longer side of the unit cell 260 is about 2 times or greater the length of the shorter side of the unit cell 260. Moreover, it is preferred that the length of the shorter side of the unit cell 260 is about 0.485 µm or shorter. In the preferred embodiment, the transistors are aligned such that the longitudinal axis of the source/drain regions are parallel to the shorter side of the unit cell 260.

An n-well 270, or a deep n-well, is formed within the unit cell 260. Preferably, the substrate is a p-type substrate, thereby providing a large p-well substantially encircling the n-well 270, on which NMOS devices may be formed. The n-well 270 is formed on the substrate by performing an implant with n-type ions as is known in the art, thereby allowing PMOS devices to be formed therein, such as the first pull-up transistor PU-1 and the second pull-up transistor PU-2.

Preferably, the NMOS active area (e.g., the source/drain areas of the first pass-gate transistor PG-1, the first pull-down transistor PD-1, the second pass-gate transistor PG-2, and the second pull-down transistor PD-2) comprises less than about 25% of the area of the unit cell 260, and the p-well area comprises less than about 65% of the area of the unit cell 260. It is also preferred that the distance between the NMOS active area and the n-well 270 be about 5 nm to about 70 nm, and more preferably about 15 nm to about 70 nm.

Figure 7:
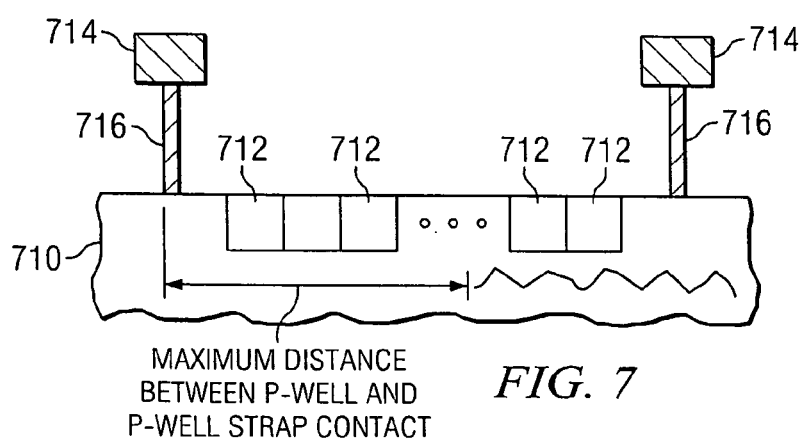
FIG. 7 is a cross-section view of an orientation of p-well straps in accordance with one embodiment of the present invention.

Furthermore, in the preferred embodiment, the maximum distance between a p-well of any memory cell and a p-well strap contact is less than 3.6 µm. FIG. 7 illustrates this embodiment for illustrative purposes only. A p-type substrate 710 has formed thereon memory cells 712, each of which may be, for example, a 6T-SRAM or an 8T-SRAM memory cell.

P-well memory straps 714 are formed on one or more of the metal layers, such as M1, M2, M3, or the like, and may be electrically coupled, for example, to ground. Plugs 716 electrically couple the p-well strap to the p-type substrate.

As illustrated in FIG. 7, the maximum distance from a p-well to a p-well strap contact is preferably less than about 3.6 µm. The maximum resistance over this distance is preferably less than about 6000 ohms, but more preferably less than about 4000 ohms.

FIG. 3 is a plan view combining M1, M2, and M3 that may be used to in conjunction with the memory cell layout illustrated in FIG. 2 in accordance with one embodiment of the present invention. For ease of reference, structures filled with back slashes indicate structures located on M3, structures filled with forward slashes indicate structures located on M2, thick-lined squares with an "X" indicate vias between M3 and M2, thin-lined squares with an "X" indicate vias between M2 and M1, and rectangles with no fill indicate straps or contact lines located on M1. Other configurations, however, may be used.

M3 includes a first $V_{ss}$ line 310, a BL 320, a $V_{cc}$ line 330, a complementary-BL 340, and a second $V_{ss}$ line 350. In this embodiment, the longitudinal axis of the lines contained on M3 are preferably parallel to the shorter side of the unit cell 260. Regarding the first $V_{ss}$ line 310, a via 312 electrically couples the $V_{ss}$ line 310 on M3 to contact line 314 on M2, which is electrically coupled to contact line 228 on M1 through via 316. The contact line 228 on M1 is electrically coupled to the source of the first pull-down transistor PD-1 as discussed above with reference to FIG. 1.

Regarding the BL 320, a via 322 electrically couples the BL 320 on M3 to contact line 324 on M2, which is electrically coupled to contact line 232 on M1 through via 326. The contact line 232 on M1 is electrically coupled to the source of the first pass-gate transistor PG-1 discussed above with reference to FIG. 2.

Regarding the $V_{cc}$ line 330, a via 332 electrically couples the $V_{cc}$ line 330 on M3 to contact line 324 on M2, which is electrically coupled to contact line 210 on M1 through via 326. The contact line 210 on M1 is electrically coupled to the source of the first pull-up transistor PU-1 as discussed above with reference to FIG. 2. Additionally, a via 333 electrically couples the $V_{cc}$ contact line 330 on M3 to contact line 325 on M2, which is electrically coupled to contact line 212 on M1 through via 327. The contact line 212 on M1 is electrically coupled to the source of the second pull-up transistor PU-2 as discussed above with reference to FIG. 2.

Regarding the complementary-BL 340, a via 342 electrically couples the complementary-BL 340 on M3 to contact line 344 on M2, which is electrically coupled to contact line 236 on M1 through via 346. The contact line 236 on M1 is electronically coupled to the source of the second pass-gate transistor PG-2 as discussed above with reference to FIG. 2.

Regarding the second $V_{ss}$ line 350, a via 352 electrically couples the $V_{ss}$ line 350 on M3 to contact line 354 on M2, which is electrically coupled to contact line 230 on M1 through via 356. The contact line 230 on M1 is electrically coupled to the source of the second pull-down transistor PD-2 as discussed above with reference to FIG. 2.

A WL 360 is located on M2 and is preferably oriented such that the longitudinal axis of the WL is parallel to the longer side of the unit cell 260. A via 362 electrically couples the WL 360 to the contact line 234 on M1, which is electrically coupled to the gate of the first pass-gate transistor PG-1 as discussed above with reference to FIG. 2. A second via 364 electrically couples the WL 360 to the contact line 238 on M1, which is electrically coupled to the gate of the second pass-gate transistor PG-2 as discussed above with reference to FIG. 2.

It should be noted that intra-cell connections 220 and 224 are shown on M1, but no connections are made to the intra-cell connections 220 and 224 from any other component or structure on M2 or M3. As noted above, the intra-cell connections 220 and 224 act to electrically couple various semiconductor components.

FIG. 4 is a plan view combining M1, M2, and M3 that may be used to in conjunction with the memory cell layout illustrated in FIG. 2 in accordance with a second embodiment of the present invention. For ease of reference, structures filled with back-slashes indicate structures located on M3, structures filled with forward slashes indicate structures located on M2, thick-lined squares with an "X" indicate vias between M3 and M2, thin-lined squares with an "X" indicate vias between M2 and M1, and rectangles with no fill indicate straps or contacts located on M1. Other configurations, however, may be used.

M3 includes a first $V_{ss}$ line 410, a second $V_{ss}$ line 420, and a WL 430. In this embodiment, the longitudinal axis of the lines contained on M3 are preferably parallel to the longer side of the unit cell 260. Regarding the first $V_{ss}$ line 410, a via 412 electrically couples the $V_{ss}$ line 410 on M3 to contact line 414 on M2, which is electrically coupled to contact line 230 on M1 through via 416. The contact line 230 on M1 is electrically coupled to the source of the second pull-down transistor PD-2 as discussed above with reference to FIG. 2. It should be noted that via 412 and via 416 substantially coincide in this plan view, and thereby appear as a single via.

Regarding the second $V_{ss}$ line 420, a via 422 electrically couples the $V_{ss}$ line 420 on M3 to contact line 424 on M2, which is electrically coupled to contact line 228 on M1 through via 426. The contact line 228 on M1 is electronically coupled to the source of the first pull-down transistor PD-1 as discussed above with reference to FIG. 2. It should be noted that via 422 and via 426 substantially coincide in this plan view, and thereby appear as a single via.

Regarding the WL 430, a via 432 electrically couples the WL 430 to the contact line 434 on M2, which is electrically coupled to contact line 234 on M1 through via 436. The contact line 234 is electrically coupled to the gate of the first pass-gate transistor PG-1 as discussed above with reference to FIG. 2. A second via 433 electrically couples the WL 430 to the contact line 435 on M2, which is electrically coupled to contact line 238 on M1 through via 437. The contact line 238 is electrically coupled to the gate of the second pass-gate transistor PG-2 as discussed above with reference to FIG. 2.

The M2 layer comprises BL 440, a $V_{cc}$ line 450, and a complementary-BL 460. In this embodiment, it is preferred that the lines on M2 are oriented such that the longitudinal axes are parallel to the shorter side of the unit cell 260.

Regarding the BL 440, a via 442 electrically couples the BL 440 on M2 to contact line 232 on M1, which is electrically coupled to the source of the first pull-gate transistor PG-1 as discussed above with reference to FIG. 2.

Regarding the $V_{cc}$ line 450, a via 452 electrically couples the $V_{cc}$ line 450 on M2 to contact line 210 on M1, which is electrically coupled to the source of the first pull-up transistor PU-1 as discussed above with reference to FIG. 2. Additionally, a via 453 electrically couples the $V_{cc}$ line 450 to contact line 212 on M1, which is electrically coupled to the source of the second pull-up transistor PU-2 as discussed above with reference to FIG. 2.

Regarding the complementary-BL 460, a via 462 electrically couples the complementary-BL 460 on M2 to contact line 236 on M1. The contact line 236 on M1 is electrically coupled to the source of the second pull-gate transistor PG-2 as discussed above with reference to FIG. 2.

It should be noted that intra-cell connections 220 and 224 are shown on M1, but no connections are made to the intra-cell connections 220 and 224 from any other component or structure on M2 or M3. As noted above, the intra-cell connections 220 and 224 act to electrically couple various semiconductor components.

Figure 5:
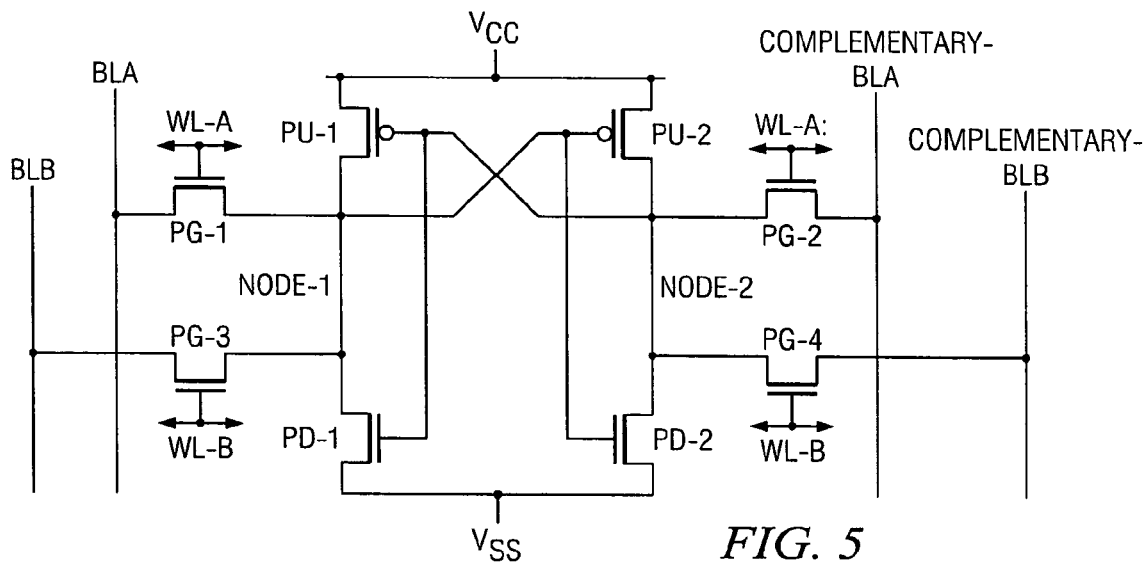
FIG. 5 is a schematic diagram of a dual-port 8T-SRAM.

FIG. 5 is a schematic of a dual-port 8T-SRAM (8T-SRAM). In operation, the 8T-SRAM operates substantially the same as the 6T-SRAM described above, except that the 8T-SRAM includes two bit lines, two complementary bit lines, and two word lines. The two bit lines, i.e., bit line A (BLA) and bit line B (BLB), and the two complementary bit lines, i.e., complementary bit line A (complementary-BLA) and complementary bit line B (complementary-BLB), provide data lines to read data from and write data to the 8T-SRAM. The two word lines, i.e., word line A (WLA) and word line B (WLB), control the pass gate transistors to control the reading and writing.

Figure 6:
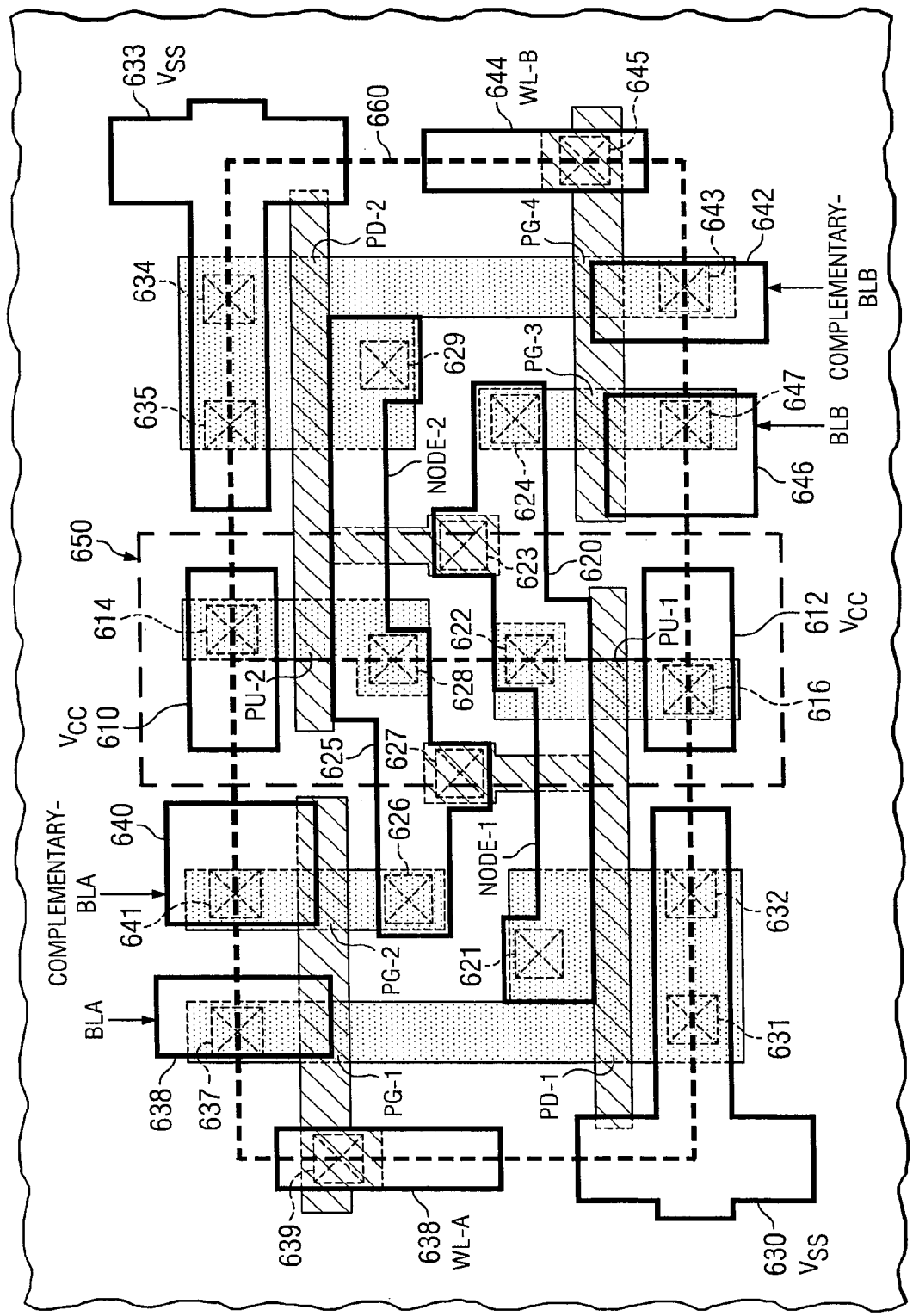
FIG. 6 is a plan view of a transistor formation and the M1 layer of a dual-port 8T-SRAM in accordance with one embodiment of the present invention.

FIG. 6 illustrates a cell layout of the 8T-SRAM illustrated in FIG. 5 in accordance with one embodiment of the present invention. The 8T-SRAM cell comprises a first pass-gate transistor PG-1, a second pass-gate transistor PG-2, a third pass-gate transistor PG-3, a fourth pass-gate transistor PG-4, a first pull-up transistor PU-1, a second pull-up transistor PU-2, a first pull-down transistor PD-1, and a second pull-down transistor PD-2 formed on a substrate. For illustrative purposes, rectangles with no fill indicate contact lines form on M1. The substrate may be, for example, formed of bulk Si, SiGe, strained-Si, SOI, non-bulk Si, or the like. The gate thicknesses of the transistors are preferably less than about 1000 Å and may be varying widths. The first and second pull-down transistors, however, preferably have a gate width of less than about 40 nm. The gate dielectric layer of the transistors may be a single layer or multiple layers, wherein at least one layer preferably comprises SiO2, nitrided oxide, a nitrogen-containing oxide, SiON, a metal oxide, a high-K dielectric, or a combination thereof. Furthermore, it is preferred that the gate oxide layer has a thickness of less than 13 Å. It has been found that using the parameters described herein, a memory cell may be fabricated having a preferred maximum storage capacitance of less than about 1 femto-farad.

Preferably, the first pull-up transistor PU-1 and the second pull-up transistor PU-2 are PMOS transistors formed in an n-well 650, or a deep n-well, and the other transistors are NMOS transistors. The sources of the first pull-up transistor PU-1 and the second pull-up transistor PU-2 are electrically coupled to a voltage source $V_{cc}$ contact lines 610 and 612, respectively, located on M1, via plugs 614 and 616.

The drain of the first pull-up transistor PU-1, the drain of the first pull-down transistor PD-1, the drain of the first pass-gate transistor PG-1, the drain of the third pass-gate transistor PG-3, and the gates of the second pull-up transistor PU-2 and second pull-down transistor PD-2 are electrically coupled via an intra-cell connection 620, also referred to as node-1, located on M1 and plugs 621, 622, 623, and 624. Similarly, the drain of the second pull-up transistor PU-2, the drain of the second pull-down transistor PD-2, the drain of the second pass-gate transistor PG-2, the drain of the fourth pass-gate transistor PG-4, and the gates of the first pull-up transistor PU-1 and first pull-down transistor PD-1 are electrically coupled via an intra-cell connection 625 located on M1 and plugs 626, 627, 628, and 629.

The source of the first pull-down transistor PD-1 is electrically coupled to ground $V_{ss}$ via $V_{ss}$ contact line 630 and plugs 631 and 632; and the source of the second pull-down transistor PD-2 is electrically coupled to ground $V_{ss}$ via $V_{ss}$ contact line 633 and plugs 634 and 635.

The source of the first pass-gate transistor PG-1 is electrically coupled to a bit line-A (BLA) via a BLA contact line 636 and plug 637. The first pass-gate transistor PG-1 electrically couples the BLA to the drain of the first pull-up transistor PU-1 and the drain of the first pull-down transistor PD-1. The gates of the first pass-gate transistor PG-1 and the second pass-gate transistor PG-2 is electrically coupled to a word line (WL) via a WL contact line 638 on M1 and plug 639.

The source of the second pass-gate transistor PG-2 is electrically coupled to the complementary bit line-A (complementary-BLA) via a complementary-BLA contact line 640 and plug 641.

Similarly, the source of the fourth pass-gate transistor PG-4 is electrically coupled to the complementary bit line-B (complementary-BLB) via a complementary-BLB contact line 642 plug 643. The fourth pass-gate transistor PG-4 electrically couples the complementary-BLB to the drain of the second pull-up transistor PU-2 and the drain of the second pull-down transistor PD-2. The gates of the fourth pass-gate transistor PG-4 and the third pass-gate transistor PG-3 are electrically coupled to a word line (WL) via a WL contact line 644 on M1 and plug 645. The source of the third pass-gate transistor PG-3 is electrically coupled to a bit-line B (BLB) via a BLB contact line 646 and plug 647. As discussed above, the drain of the third pass-gate transistor PG-3 is electrically coupled to the gates of the second pull-up transistor PU-2 and the second pull-down transistor PD-2, the drain of the first pull-up transistor PU-1, the drain of the first pull-down transistor PD-1 and the drain of the first pass-gate transistor PG-1.

One of ordinary skill in the art will appreciate that the above structure defines a unit or memory cell 660, as illustrated by the dotted line. The unit cell 660 defines the basic building block for designing memory cells and may be duplicated to create larger memories. In the preferred embodiment, the length of the longer side of the unit cell 660 is about 2 times or greater the length of the shorter side of the unit cell 660. Moreover, it is preferred that the length of the shorter side of the unit cell 660 is about 0.745 μm or shorter. It is also preferred that the area of the unit cell 660 is less than about 1.2 μm2. In the preferred embodiment, the transistors are aligned such that the longitudinal axis of the source/drain regions are parallel to the shorter side of the unit cell 660.

An n-well 650, or a deep n-well, is formed within the unit cell 660. Preferably, the substrate is a p-type substrate, thereby providing a large p-well substantially encircling the n-well, on which NMOS devices may be formed. The n-well 650 is formed on the substrate by performing an implant with n-type ions as is known in the art, thereby allowing PMOS devices to be formed therein, such as the first pull-up transistor PU-1 and the second pull-up transistor PU-2.

Preferably, the NMOS active area (e.g., the source/drain areas of the first pass-gate transistor PG-1, the first pull-down transistor PD-1, the second pass-gate transistor PG-2, and the second pull-down transistor PD-2) comprises less than about 33% of the area of the unit cell 660, and the p-well area comprises less than about 75% of the area of the unit cell 660. It is also preferred that the distance between the NMOS active area and the n-well 650 be about 5 nm to about 100 nm, and more preferably about 15 nm to about 100 μm. The maximum distance between a p-well and a p-well strap contact is preferably less than 3.6 μm and has a resistance of 6000 ohms, but more preferably 4000 ohms. The p-well strap is discussed above with reference to FIG. 7.

Although particular embodiments of the invention have been described in detail with reference to specific embodiments, it is understood that the invention is not limited correspondingly in scope, but includes all changes, modifications, and equivalents coming within the spirit and terms of the claims appended hereto. For example, different arrangements of the metal layers may be used. Accordingly, it is understood that this invention may be extended to other structures and materials, and thus, the specification and figures are to be regarded in an illustrative rather than a restrictive sense.

What is claimed is:

1. A memory cell comprising:

a p-well area having a first portion and a second portion, the first portion having a first pass-gate transistor and a first pull-down transistor, the second portion having a second pass-gate transistor and a second pull-down transistor; and an n-well area positioned between the first portion and the second portion, the n-well area having a first pull-up transistor and a second pull-up transistor;

wherein the memory cell has a long side and a short side, the long side being at least twice as long as the short side, the short side being less than 0.485 μm, and a longitudinal axis of the p-well being parallel to the short side the gate of the first pass-gate transistor is electrically coupled to a word line;

the source of the first pass-gate transistor is electrically coupled to a bit line;

the drain of the first pass-gate transistor is electrically coupled to the drain of the first pull-down transistor;

the source of the first pull-down transistor is electrically coupled to a $V_{ss}$ line;

the drain of the first pass-gate transistor, the drain of the first pull-up transistor, the drain of the first pull-down transistor, the gate of the second pull-down transistor, and second pull-up transistor are electrically coupled;

the drain of the second pass-gate transistor, the drain of the second pull-up transistor, the drain of the second pull-down transistor, the gate of the first pull-down transistor, and first pull-up transistor are electrically coupled;

the source of the first pull-up transistor is electrically coupled to a $V_{cc}$ line;

the source of the second pull-up transistor is electrically coupled to the $V_{cc}$ line;

the gate of the second pass-gate transistor is electrically coupled to the word line;

the source of the second pass-gate transistor is electrically coupled to a bit line bar;

the drain of the second pass-gate transistor is electrically coupled to the drain of the second pull-down transistor;

the source of the second pull-down transistor is electrically coupled to the $V_{ss}$ line; and a longitudinal axis along the source-to-direction of each transistor is substantially parallel to the shorter side of the memory cell.

2. The memory cell of claim 1, wherein resistance between a p-well to a p-well strap contact is less than about 4000 ohm.

3. The memory cell of claim 1, wherein the distance from a p-well to a p-well strap contact is less than about 3.6 um.

4. The memory cell of claim 1, wherein the p-well area is less than about 65% of the memory cell.

5. The memory cell of claim 1, wherein the distance of the n-well area to the NMOS active area is less than about 75 nm.

6. The memory cell of claim 1, wherein the NMOS active region is less than about 25% of the memory cell.

7. The memory cell of claim 1, wherein the n-well is a deep n-well.

8. The memory cell of claim 1, wherein the p-well substantially encircles the n-well.

9. The memory cell of claim 1, wherein the memory cell includes a plurality of $V_{ss}$ lines, the plurality of $V_{ss}$ lines being located on one or more metal layers.

10. The memory cell of claim 1, wherein the memory cell has an area of less than about 0.4 μm2, at least one of the PMOS transistors or the NMOS transistors have a gate thickness less than about 1000 Å, and the memory cell includes at least one pull-down transistor having a gate width of less than about 40 nm.

11. The memory cell of claim 1, wherein at least one of the first pull-up transistors and the second pull-up transistor has a gate layer and a gate oxide layer and the gate oxide layer having one or more layers and at least one layer comprising SiO2, nitrided oxide, nitrogen content oxide, SiON, metal oxide, high K dielectric, or a combination thereof.

12. The memory cell of claim 1, wherein at least one of the first pull-down transistor and the second pull-down transistor have a gate width of less than about 40 nm and a gate oxide thickness of less than 13 Å.

13. The memory cell of claim 1, wherein the memory cell has a maximum storage capacitance of less than about 0.5 femto-farad.

14. The memory cell of claim 1, wherein each bit line is parallel to the longitudinal axis of the p-well.

15. The memory cell of claim 1, wherein the memory cell is formed on a substrate comprising bulk-Si, SiGe, strain-Si, SOI, non-bulk Si, or a combination thereof.

16. The memory cell of claim 1, wherein the memory cell includes at least one bit line, each bit line having a $V_{cc}$ line and a $V_{ss}$ line adjacent the bit line.

17. The memory cell of claim 1, wherein the memory cell includes a plurality of metal layers, and the memory cell includes a bit line and a complementary bit line, the bit line and the complementary bit line being on different metal layers.

18. A memory cell comprising:

a p-well area having a first portion and a second portion, the first portion having a first pass-gate transistor, a second pass-gate transistor, and a first pull-down transistor, the second portion having a third pass-gate transistor, a fourth pass-gate transistor and a second pull-down transistor; and an n-well area positioned between the first portion and the second portion, the n-well area having a first pull-up transistor and a second pull-up transistor;

wherein the memory cell has a long side and a short side, the long side being at least twice as long as the short side, the short side being less than 0.745 μm, and a longitudinal axis of the p-well being parallel to the short side;

the gates of the first pass-gate transistor and second pass-gate transistor are electrically coupled to a first word line;

the gates of the third pass-gate transistor and fourth pass-gate transistor are electrically coupled to a second word line;

the source of the first pass-gate transistor is electrically coupled to a first bit line;

the source of the third pass-gate transistor is electrically coupled to a second bit line;

the drain of the first pass-gate transistor is electrically coupled to the drain of the first pull-down transistor;

the source of the first pull-down transistor is electrically coupled to a $V_{ss}$ line;

the source of the second pull-down transistor is electrically coupled to a $V_{ss}$ line;

the drain of the first pass-gate transistor, the drain of the first pull-down transistor, the drain of the first pull-up transistor, the gate of the second pull-down transistor, the gate of the second pull-up transistor, and the drain of the third pass-gate transistor are electrically coupled;

the drain of the fourth pass-gate transistor, the drain of the second pull-down transistor, the drain of the second pull-up transistor, the gate of the first pull-down transistor, the gate of the first pull-up transistor, and the drain of the second pass-gate transistor are electrically coupled;

the source of the first pull-up transistor is electrically coupled to a $V_{cc}$ line;

the source of the second pull-up transistor is electrically coupled to the $V_{cc}$ line;

the source of the second pass-gate transistor is electrically coupled to a first complementary bit line;

the source of the fourth pass-gate transistor is electrically coupled to a second complementary bit line; and a longitudinal axis along the source-to-direction of each transistor is substantially parallel to the shorter side of the memory cell.

19. The memory cell of claim 18, wherein resistance between a p-well to a p-well strap contact is less than about 4000 ohm.

20. The memory cell of claim 18, wherein the distance from a p-well to a p-well strap contact is less than about 3.6 um.

21. The memory cell of claim 18, wherein the p-well area is less than about 75% of the memory cell.

22. The memory cell of claim 18, wherein the distance of the n-well area to the NMOS active area is less than about 100 nm.

23. The memory cell of claim 18, wherein the NMOS active region is less than about 33% of the memory cell.

24. The memory cell of claim 18, wherein the n-well is a deep n-well.

25. The memory cell of claim 18, wherein the p-well substantially encircles the n-well.

26. The memory cell of claim 18, wherein the memory cell includes a plurality of $V_{ss}$ lines, the plurality of $V_{ss}$ lines being located on one or more metal layers.

27. The memory cell of claim 18, wherein the memory cell has an area of less than about 1.2 µm2, at least one of the PMOS transistors or the NMOS transistors have a gate thickness less than about 1000 Å.

28. The memory cell of claim 18, wherein at least one of the first pull-up transistors and the second pull-up transistor has a gate layer and a gate oxide layer and the gate oxide layer having one or more layers and at least one layer comprising SiO2, nitrided oxide, nitrogen content oxide, SiON, metal oxide, high K dielectric, or a combination thereof.

29. The memory cell of claim 18, wherein at least one of the first pull-down transistor and the second pull-down transistor have a gate width of less than about 40 nm and a gate oxide thickness of less than 13 Å.

30. The memory cell of claim 18, wherein the memory cell has a maximum storage capacitance of less than about 1 femto-farad.

31. The memory cell of claim 18, wherein each bit line is parallel to the longitudinal axis of the p-well.

32. The memory cell of claim 18, wherein the memory cell is formed on a substrate comprising bulk-Si, SiGe, strain-Si, SOI, non-bulk Si, or a combination thereof.

33. The memory cell of claim 18, wherein the memory cell includes at least one bit line, each bit line having at least on of a $V_{cc}$ line or a $V_{ss}$ line adjacent the bit line.

* * * * *

UNITED STATES PATENT AND TRADEMARK OFFICE
CERTIFICATE OF CORRECTION

PATENT NO. : 7,271,451 B2  Page 1 of 1
APPLICATION NO. : 11/340397
DATED : September 18, 2007
INVENTOR(S) : Liaw It is certified that error appears in the above-identified patent and that said Letters Patent is hereby corrected as shown below:

On The Title Page Item (57) Abstract, delete "us" and insert --use--.
In Col. 4, line 61, delete "to".
In Col. 5, line 61, delete "to".
In Col. 8, line 4, delete "642" and insert --642 and--.
In Col. 12, line 35, delete "on" and insert --one--.

Signed and Sealed this

Eighteenth Day of March, 2008

JON W. DUDAS
*Director of the United States Patent and Trademark Office*